US 11,668,853 B2

(12) United States Patent
Kushwaha et al.

(10) Patent No.: US 11,668,853 B2
(45) Date of Patent: Jun. 6, 2023

(54) PETROPHYSICAL INVERSION WITH MACHINE LEARNING-BASED GEOLOGIC PRIORS

(71) Applicant: ExxonMobil Technology and Engineering Company, Spring, TX (US)

(72) Inventors: Amit Kushwaha, The Woodlands, TX (US); Ratnanabha Sain, Houston, TX (US); Jan Schmedes, Bellaire, TX (US); Yunfei Yang, Palo Alto, CA (US)

(73) Assignee: ExxonMobil Technology and Engineering Company, Spring, TX (US)

( * ) Notice: Subject to any disclaimer, the term of this patent is extended or adjusted under 35 U.S.C. 154(b) by 186 days.

(21) Appl. No.: 15/929,505

(22) Filed: May 6, 2020

(65) Prior Publication Data

US 2021/0041596 A1     Feb. 11, 2021

Related U.S. Application Data

(60) Provisional application No. 62/883,348, filed on Aug. 6, 2019.

(51) Int. Cl.
*G01V 99/00* (2009.01)
*G06F 30/27* (2020.01)
(Continued)

(52) U.S. Cl.
CPC ............ *G01V 99/005* (2013.01); *E21B 49/00* (2013.01); *G01V 1/282* (2013.01); *G01V 1/306* (2013.01);
(Continued)

(58) Field of Classification Search
CPC ...... G01V 99/005; G01V 1/282; G01V 1/306; G01V 11/00; G01V 2210/614;
(Continued)

(56) References Cited

U.S. PATENT DOCUMENTS 8,843,353 B2   9/2014  Posamentier et al.
8,923,094 B2   12/2014 Jing et al.
(Continued)

FOREIGN PATENT DOCUMENTS

CN       107783183 A     3/2018

OTHER PUBLICATIONS

Mukerji, Tapan, et al. "Monte carlo AVO analysis for lithofacies classification." 2006 SEG Annual Meeting. OnePetro, 2006. pp. 1781-1785. (Year: 2006).*

(Continued)

*Primary Examiner* — John E Johansen
(74) *Attorney, Agent, or Firm* — ExxonMobil Technology and Engineering Company—Law Department

(57) ABSTRACT

A method and system for modeling a subsurface region include applying a trained machine learning network to an initial petrophysical parameter estimate to predict a geologic prior model; and performing a petrophysical inversion with the geologic prior model, geophysical data, and geophysical parameters to generate a rock type probability model and an updated petrophysical parameter estimate. Embodiments include managing hydrocarbons with the rock type probability model. Embodiments include checking for convergence of the updated petrophysical parameter estimate; and iteratively: applying the trained machine learning network to the updated petrophysical parameter estimate of a preceding iteration to predict an updated rock type probability model and another geologic prior model; performing a petrophysical inversion with the updated geologic prior model, geo-
(Continued)

physical seismic data, and geophysical elastic parameters to generate another rock type probability model and another updated petrophysical parameter estimate; and checking for convergence of the updated petrophysical parameter estimate.

26 Claims, 6 Drawing Sheets

(51) Int. Cl.
  *E21B 49/00* (2006.01)
  *G01V 1/28* (2006.01)
  *G01V 1/30* (2006.01)
  *G06N 3/08* (2023.01)
  *G01V 11/00* (2006.01)

(52) U.S. Cl.
  CPC .............. *G01V 11/00* (2013.01); *G06F 30/27* (2020.01); *G06N 3/08* (2013.01); *E21B 2200/20* (2020.05); *G01V 2210/614* (2013.01); *G01V 2210/6242* (2013.01); *G01V 2210/6244* (2013.01); *G01V 2210/667* (2013.01)

(58) Field of Classification Search
  CPC ... G01V 2210/6242; G01V 2210/6244; G01V 2210/667; E21B 49/00; E21B 2200/20; G06F 30/27; G06N 3/08
  USPC .......................................................... 703/10
  See application file for complete search history.

(56) References Cited

U.S. PATENT DOCUMENTS

| | | | |
|---|---|---|---|
| 11,397,272 B2* | 7/2022 | Liu | .......................... G01V 1/28 |
| 2018/0156932 A1 | 6/2018 | Sain | |
| 2019/0056518 A1 | 2/2019 | Wheelock | |
| 2019/0064389 A1* | 2/2019 | Denli | ........................ G06N 3/04 |
| 2020/0088896 A1 | 3/2020 | Schmedes et al. | |

OTHER PUBLICATIONS

Lopes, Rui L., and Alipio Jorge. "Mind the Gap: A Well Log Data Analysis." arXiv preprint arXiv:1705.03669 (2017). pp. 1-6. (Year: 2017).*

Aleardi et al. (2018) "Two-stage and single stage seismic petrophysical inversion applied in the Nile Delta," The Leading Edge (Jul. 2018), pp. 510-518.

Gao et al. (2012) "Joint petrophysical inversion of electromagnetic and full-waveform seismic data," Geophysics, vol. 77, Issue 3, pp. WA3-WA18.

Laloy et al. (2018) "Training-Image Based Geostatistical Inversion Using a Spatial Generative Adversarial Neural Network", AGU Publications, Water Resources Research (Jan. 8, 2018), pp. 381-406.

Powers, D.M.W. (2011) "Evaluation: From Precision, Recall and F-Measure to ROC, Informedness, Markedness & Correlation", Journal of Machine Learning Technologies, ISSN: 2229-3981 & ISSN: 2229-399X, vol. 2, Issue 1, pp. 37-63.

Zhang et al. (2018) "Multiparameter elastic full waveform inversion with facies-based constraints," Geophysical Journal International, vol. 213, pp. 2112-2127.

Jeong et al. (2017), "A Fast Approximation for Seismic Inverse Modeling: Adaptive Spatial Resampling", Mathematical Geosciences, vol. 49, No. 7, Jul. 7, 2017 (Jul. 7, 2017), pp. 845-869 XP055646676.

Kumar et al. (2016), "A model-based approach for integration analysis of well log and seismic data for reservoir characterization", Geosciences Journal, The Geological Society of Korea, Heidelberg, vol. 20, No. 3, Jun. 2016, pp. 331-350.

Larsen, A. L. et al. (2006) "Bayesian Lithography/Fluid Prediction and Simulation on the Basis of a Markov-Chain Prior Model", Geophysics, Society of Exploration Geophysicists, US, vol. 71, No. 5, pp. R69-R78. (XP001249719).

* cited by examiner

PETROPHYSICAL INVERSION WITH MACHINE LEARNING-BASED GEOLOGIC PRIORS

CROSS-REFERENCE TO RELATED APPLICATIONS

This application claims the benefit of U.S. Provisional Application 62/883,348, filed Aug. 6, 2018 and entitled "Petrophysical Inversion With Machine Learning-Based Geologic Priors", the entirety of each of which is incorporated by reference herein.

FIELD

This disclosure relates generally to the field of geophysical prospecting and, more particularly, to prospecting for hydrocarbons and related data processing. Specifically, exemplary embodiments relate to methods and apparatus for generating subsurface models of rock properties applicable at multiple scales, such as seismic scales, sub-seismic scales, and well log scales.

BACKGROUND

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

An important goal of geophysical prospecting is to accurately image subsurface structures to assist in the identification and/or characterization of hydrocarbon-bearing formations. Geophysical prospecting may employ a variety of data-acquisition techniques, including seismic prospecting, electromagnetic prospecting, well logging, etc. Such data may be processed, analyzed, and/or examined with a goal of identifying geological structures that may contain hydrocarbons.

Geophysical data (e.g., acquired seismic data) and/or reservoir surveillance data (e.g., well logs) may be analyzed to develop subsurface models (e.g., models of geology, including rock types). For example, one or more inversion procedures may be utilized to analyze the geophysical data and produce models of rock properties and/or fluid properties. Generally, inversion is a procedure that finds a parameter model, or collection of models, which, through simulation of some physical response to those parameters, can reproduce to a chosen degree of fidelity a set of measured data. Inversion may be performed, for example, on seismic data to derive a model of the distribution of elastic-wave velocities within the subsurface of the earth. Naive parameterization of a subsurface model (e.g., by uniform discretization) may utilize many volume elements (voxels) of uniform elastic-wave velocities to match simulated data to the observed seismic data.

Non-uniqueness is a pervasive feature of geophysical inversion problems. Geophysical surveys typically acquire data at locations remote from the subsurface region of interest (e.g., at the surface of the earth or a body of water) and at narrow frequency bands (e.g., from about 3 Hz to about 60 Hz) due to the physical limitations of the survey (e.g., to generate lower frequencies, impractically large sources may be utilized, while mechanical loss and wavefield scattering tend to attenuate seismic waves at higher frequencies). These limitations lead to incomplete information and large uncertainty about the subsurface region of interest.

Some recently-proposed geophysical data analysis methods utilize machine learning. For example, horizon interpretation and/or fault interpretation problems have been staged as machine learning tasks, where a set of manually-labelled horizon images and/or fault images are part of training data. Typically, machine learning systems utilize an objective function to characterize the error between manually-labeled images and predicted labeling.

Petrophysical inversion generally transforms elastic parameters, such as seismic velocity and density, to petrophysical parameters, such as porosity and volume of clay ($V_{clay}$). For example, petrophysical inversion can transform compressional velocity, shear velocity, and density well logs to porosity and/or $V_{clay}$ logs. As another example, petrophysical inversion can utilize elastic information from seismic data, including traditional images of reflectivity and tomographic velocity, to predict three-dimensional volumes of porosity and $V_{clay}$. (Elastic information may be determined from seismic data by any suitable means, including in some cases by seismic inversion to solve for an elastic or similar geophysical properties model based on input seismic data.) As used herein, $V_{clay}$ refers to rock volumes including anything that is not sand (e.g., shale). That is, we will treat clay and shale (and associated properties such as $V_{clay}$ and $V_{shale}$) interchangeably with the recognition that they are not strictly the same from a mineralogical standpoint. For the present application's purposes, however, it is suitable to treat them interchangeably as one of the volumetric mineral end-members of subsurface rocks, the other one being sand. Furthermore, petrophysical inversion can include other geophysical data types, namely electromagnetic data or resistivity, which tend to have a better sensitivity to water saturation than elastic parameters. Although petrophysical inversion may be carried out with input elastic information or elastic parameters (which may, as noted, be determined from seismic data via, e.g., seismic inversion), or carried out with input electromagnetic data or resistivity as just noted, in some cases petrophysical inversion may be used to determine petrophysical parameters from input seismic data. In such a case, the petrophysical inversion may be referred to as an "integrated petrophysical inversion" insofar as it encompasses inversion sometimes associated with seismic inversion processes (e.g., determining elastic parameters from seismic data).

Seismic data is typically sampled in a limited frequency band (e.g., about 4 Hz to about 50 Hz). Rock properties predicted from seismic and/or petrophysical inversion (including integrated petrophysical inversion) may maintain the bandlimited nature of the seismic data, resulting in smooth representations of sharp layer boundaries. Attribute calibration workflows, which are often uncertain, are typically used to estimate layer thickness from the smooth representations. Layer thickness is useful for reservoir assessment, geologic model building, well planning, and other aspects of hydrocarbon management, including prospecting, exploration, and development. However, layer thickness and petrophysical property estimates may become inaccurate as thickness approaches the detectability limit.

Petrophysical inversion may be performed on data obtained (and/or performed on parameters derived from data obtained) at typical seismic frequency bands. However, resolution may be lacking at higher frequencies (e.g., frequencies larger than ~50 Hz), resulting in a lack of resolution at finer spatial scales, known as sub-seismic resolution (e.g., less than about 10 m spatial scale in the vertical direction, meaning that it is possible to resolve a sand or other geological feature that is thinner than 10 m in the petrophysical inversion carried out using such data). Resolution at these sub-seismic scales is important for understanding the flow behavior of a reservoir, e.g. fluctuation of properties on the order of 1 m in the depth domain. Although a variety of algorithms are known for estimating properties at sub-seismic resolution scales from a petrophysical inversion, none provide certainty. For example, several different models may have the same low frequency (e.g., less than about 50 Hz) components as the inversion result while having different spatial components (e.g., layer thickness) at sub-seismic resolution scales.

Moreover, existing approaches useful for estimating petrophysical parameters may not be capable of identifying rock types with certainty. For example, rock types identified at seismic resolution scales may not extend to well log resolution scales, e.g., on the order of 15 cm to 100 cm. Current implementations may only be able to predict simplistic rock types.

More efficient equipment and techniques to identify rock types and/or rock type probabilities from petrophysical inversion would be beneficial.

SUMMARY

Embodiments of the present disclosure provide enhanced systems and methods for estimating rock properties. Better estimation of rock properties may improve results from geophysical modeling and/or interpretation (e.g., identification of geologic features, faults, horizons, salt domes, etc.). For example, rock type probability models may exhibit sharper boundaries than seismic data models, thereby facilitating more precise interpretation. Such rock type probability models may facilitate sharp, geologically-consistent predictions for object extraction by incorporating geological priors and/or interpreters' expectations into training for learning seismic patterns. Machine learning technology may be utilized to automatically infer rock types from petrophysical parameters in the context of a sequence labeling problem. Embodiments may enhance the automation of generation of subsurface models. Embodiments include modeling a subsurface region by applying a trained machine learning network to an initial petrophysical parameter estimate to predict a geologic prior model; and performing a petrophysical inversion with the geologic prior model, geophysical data, and geophysical parameters to generate a rock type probability model and an updated petrophysical parameter estimate. Embodiments include managing hydrocarbons with the rock type probability model.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 4A-4F illustrate an exemplary set of confusion matrices comparing the prediction accuracy of a machine learning network trained on four rock types and 40 Hz data and making predictions on test data containing six different frequencies.

DETAILED DESCRIPTION

Figure 1:
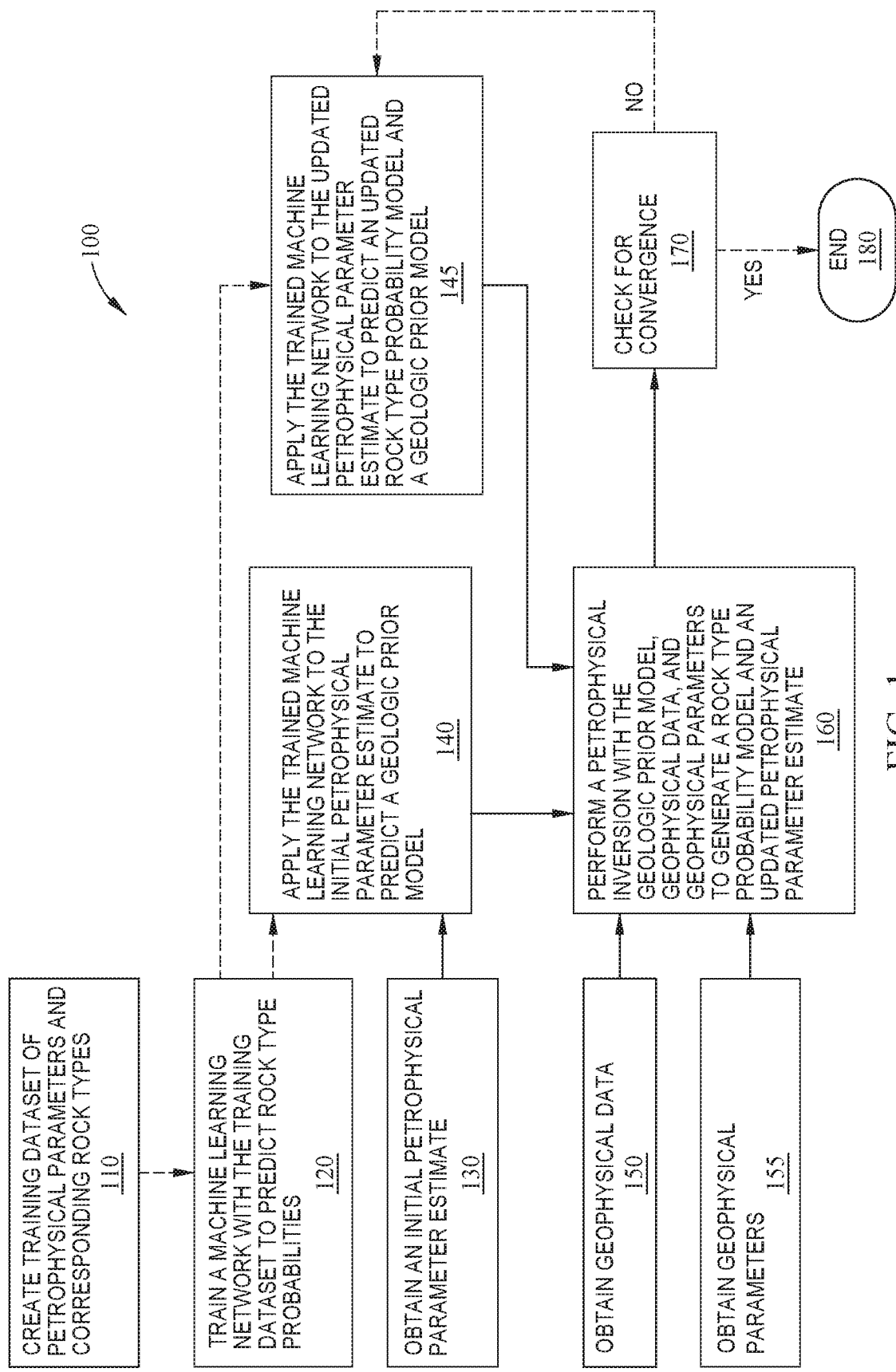
FIG. 1 illustrates an exemplary method of petrophysical inversion with machine learning-based geologic priors.

It is to be understood that the terminology used herein is for the purpose of describing particular embodiments only, and is not intended to be limiting. As used herein, the singular forms "a," "an," and "the" include singular and plural referents unless the content clearly dictates otherwise. Furthermore, the words "can" and "may" are used throughout this application in a permissive sense (i.e., having the potential to, being able to), not in a mandatory sense (i.e., must). The term "include," and derivations thereof, mean "including, but not limited to." The term "coupled" means directly or indirectly connected. The word "exemplary" is used herein to mean "serving as an example, instance, or illustration." Any aspect described herein as "exemplary" is not necessarily to be construed as preferred or advantageous over other aspects. The term "uniform" means substantially equal for each sub-element, within about ±10% variation. The term "nominal" means as planned or designed in the absence of variables such as wind, waves, currents, or other unplanned phenomena. "Nominal" may be implied as commonly used in the fields of seismic prospecting and/or hydrocarbon management.

The term "seismic data" as used herein broadly means any data received and/or recorded as part of the seismic surveying process, including particle displacement, velocity and/or acceleration, continuum pressure and/or rotation, wave reflection, and/or refraction data; but "seismic data" also is intended to include any data or properties, including geophysical properties such as one or more of: elastic properties (e.g., P and/or S wave velocity, P-Impedance, S-Impedance, density, and the like); seismic stacks (e.g., seismic angle stacks); compressional velocity models; or the like, that the ordinarily skilled artisan at the time of this disclosure will recognize may be inferred or otherwise derived from such data received and/or recorded as part of the seismic surveying process. Thus, we may at times refer to "seismic data and/or data derived therefrom," or equivalently simply to "seismic data." Both terms are intended to include both measured/recorded seismic data and such derived data, unless the context clearly indicates that only one or the other is intended. "Seismic data" may also include data derived from traditional seismic (i.e., acoustic) datasets in conjunction with other geophysical data, including, for example, gravity plus seismic, gravity plus electromagnetic plus seismic data, etc. For example, joint-inversion utilizes multiple geophysical data types.

As used herein, "inversion" refers to a geophysical method which is used to estimate subsurface properties (such as elastic properties like velocity or density). Typically, inversion begins with a starting subsurface physical properties model. Synthetic seismic data may be generated (e.g., by solving a wave equation, in order to simulate "waves" passing through the modeled subsurface with the starting physical properties). The synthetic seismic data generated by this simulation are compared with the field seismic data, and, using the differences between the two, the value of an objective function is calculated. To minimize the objective function, a modified subsurface physical properties model is generated which is used to simulate a new set of synthetic seismic data. This new set of synthetic seismic data is compared with the field data to recalculate the value of the objective function. Typically, an objective function optimization procedure is iterated by using the new updated model as the starting model for finding another search direction, which may then be used to perturb the model in order to better explain the observed data. The process continues until an updated model is found that satisfactorily explains the observed data. A global or local optimization procedure can be used to minimize the objective function and to update the subsurface model. Commonly used local objective function optimization procedures include, but are not limited to, gradient search, conjugate gradients, quasi-Newton, Gauss-Newton, and Newton's method. Commonly used global methods include, but are not limited to, Monte Carlo or grid search. Inversion may also refer to joint inversion with multiple types of data used in conjunction. Specific inversion techniques may include Full Wavefield Inversion (seismic or electromagnetic), seismic tomography, seismic velocity model building, potential fields inversion, reservoir history matching, and any combination thereof.

The term "physical property model" or other similar models discussed herein refer to an array of numbers, typically a 3-D array (although it may instead be a 2-D array), where each number, which may be called a model parameter, is a value of velocity, density, or another physical property in a cell, where a subsurface region has been conceptually divided into discrete cells for computational purposes. For example, a 3-D geologic model may be represented in volume elements (voxels), in a similar way that a 2-D photograph is represented by picture elements (pixels). However, it should be appreciated that where a "pixel" is referenced, it should be understood that the term "voxel" can equivalently be substituted to extend the concept of the 3-D case, and vice-versa, that where a "voxel" is referenced, the term "pixel" can equivalently be substituted to extend the referenced concept into the context of the 2-D case.

As used herein, "hydrocarbon management" or "managing hydrocarbons" includes any one or more of the following: hydrocarbon extraction; hydrocarbon production, (e.g., drilling a well and prospecting for, and/or producing, hydrocarbons using the well; and/or, causing a well to be drilled to prospect for hydrocarbons); hydrocarbon exploration; identifying potential hydrocarbon-bearing formations; characterizing hydrocarbon-bearing formations; identifying well locations; determining well injection rates; determining well extraction rates; identifying reservoir connectivity; acquiring, disposing of, and/or abandoning hydrocarbon resources; reviewing prior hydrocarbon management decisions; and any other hydrocarbon-related acts or activities. The aforementioned broadly include not only the acts themselves (e.g., extraction, production, drilling a well, etc.), but also or instead the direction and/or causation of such acts (e.g., causing hydrocarbons to be extracted, causing hydrocarbons to be produced, causing a well to be drilled, causing the prospecting of hydrocarbons, etc.).

As used herein, "obtaining" data or models generally refers to any method or combination of methods of acquiring, collecting, or accessing data or models, including, for example, directly measuring or sensing a physical property, receiving transmitted data, selecting data from a group of physical sensors, identifying data in a data record, generating models from assemblages of data, generating data or models from computer simulations, retrieving data or models from one or more libraries, and any combination thereof.

The term "label" generally refers to identifications and/or assessments of correct or true outputs provided for a given set of inputs. Labels may be of any of a variety of formats, including text labels, data tags (e.g., binary value tags), pixel attribute adjustments (e.g., color highlighting), n-tuple label (e.g., concatenation and/or array of two or more labels), etc.

If there is any conflict in the usages of a word or term in this specification and one or more patent or other documents that may be incorporated herein by reference, the definitions that are consistent with this specification should be adopted for the purposes of understanding this disclosure.

Embodiments of the present disclosure provide enhanced systems and methods for estimating rock properties. One of the many potential advantages of the disclosed embodiments include better estimation of rock properties that may directly enable improved results from geophysical modeling and/or interpretation (e.g., identification of geologic features, faults, horizons, salt domes, etc.). For example, rock type probability models may exhibit sharper boundaries than seismic data models, thereby facilitating more precise interpretation. Other potential advantages include one or more of the following, among others that will be apparent to the skilled artisan with the benefit of this disclosure: producing sharp, geologically-consistent predictions for object extraction; incorporating geological priors and/or interpreters' expectations (e.g., image priors) into training for learning seismic patterns (especially training of a machine learning system); mitigating uncertainty in rock type probability models with the use of additional data, such as geologic priors (geological information that was available before the solution was formed and which was incorporated into the solution), well logs, and/or joint inversion of different geophysical data sets; utilizing machine learning technology to automatically infer rock types from petrophysical parameters in the context of a sequence labeling problem; and enhanced automation of procedures for generating subsurface models. Such automation may accelerate the generation of subsurface models, reduce subjective bias or error, and reduce the geoscience workforce's exposure to ergonomic health risks (e.g., exposure to repetitive tasks and injuries therefrom). Embodiments of the present disclosure can thereby be useful in hydrocarbon management, including in the prospecting for, discovery of, and/or extraction of hydrocarbons from subsurface formations.

Embodiments disclosed herein may include utilizing a machine learning system to infer rock type from petrophysical parameters. For example, a deep neural network (DNN) may be trained to infer rock type from petrophysical parameters. Training data for a DNN may, in various embodiments, include synthetically generated subsurface physical property models consistent with provided geological priors. The computer-simulated data may be based on the governing equations of geophysics and the generated subsurface physical property models. The training data for the DNN may include migrated or stacked geophysical (e.g., seismic) data with interpretations (e.g., labeling) done manually. The DNN may be trained using a combination of synthetic and acquired geophysical data. The DNN may represent the rock types and/or petrophysical parameters as a nested hierarchy of concepts, with each concept defined in relation to simple concepts, and more abstract representations computed in terms of less abstract ones.

FIG. 1 illustrates an exemplary method 100 of petrophysical inversion with machine learning-based geologic priors according to some embodiments. As illustrated, method 100 begins at block 110 where a training dataset is created. The training dataset may exhibit plausible geologic behavior relevant to the subsurface region of interest, including petrophysical parameters (e.g., porosity, permeability, density, resistivity, elastic wave velocities, etc.) and corresponding rock types. The training dataset may comprise actual field-recorded data, or interpretations thereof, in geologic model form, and/or models resulting from computer simulations of earth processes. The training dataset may comprise multiple petrophysical parameters. For example, the training dataset may include a tabular listing of petrophysical parameters and potentially corresponding rock types. As another example, the training dataset may include a listing of petrophysical parameters and probability-weighted listings of pluralities of potentially corresponding rock types. As another example, the training dataset may include charts, graphs, and/or other data structures relating petrophysical parameters to potentially corresponding rock types. As yet another example, the training dataset may include representations of subsurface regions (e.g., models and/or images) with identified rock types (e.g., labels). In some embodiments, a combination of any two or more of these types of datasets may be included in the training dataset.

In some embodiments, the training datasets may be generated from existing datasets (e.g., representations of known subsurface regions). For example, existing subsurface data may be manually and/or automatically labeled to identify petrophysical parameters and corresponding rock types. In some embodiments, the training datasets may be generated by simulation to synthesize subsurface data, including petrophysical parameters and corresponding rock types. In some embodiments, a combination of any two or more of these methods may be utilized to generate the training dataset. Note that a robust training dataset may be characterized as including representations (e.g., 1-D pseudo wells, 3-D models created by process stratigraphy, etc.) of subsurface regions (actual or simulated) at a one or more scales (e.g., grid spacing of 0.5 m, 1 m, and 1.5 m) and/or frequency regions (e.g., for seismic data with a maximum frequency of about 60 Hz, selected frequency regions may include 60 Hz, 70 Hz, 80 Hz, 90 Hz, and 100 Hz). For example, four or five frequency ranges may be utilized. In some embodiments, one or more sets of frequencies and/or mixtures thereof may be utilized (e.g., broadband). In some embodiments, one or more frequencies may be selected (e.g., randomly) for each trace from a large number of frequencies in a pre-defined range. For example, the training dataset may be generated by creating synthetic 1-D, 2-D, or 3-D volumes of petrophysical parameters (at the same sampling scale as will be used with the inversion) and rock types (at various scales), and by filtering the petrophysical parameters at various frequencies to get a multitude of subsets, each with the multitude of rock types at various scales. The final training set may consist of sets of petrophysical parameters at various frequencies and various scales of rock types.

In some embodiments, the training dataset created at block 110 may include large volumes of data suitable for use with a deep learning algorithm. Suitable deep learning systems and methods are further described in co-pending U.S. Provisional Patent Application Ser. No. 62/731,182, entitled "Reservoir Characterization Utilizing Resampled Seismic Data," filed Sep. 14, 2018, which is herein incorporated by reference. In some embodiments, the learning process may utilize a large-volume training dataset to fit numerous parameters. It should be appreciated that large volumes of data having appropriate petrophysical parameter and/or rock property information may be rare in typical oil and gas operations. For example, an appropriate training dataset may include thousands of well logs, each having various rock type labels, as provided by one or more experienced geoscientists. It should be appreciated that such well data is sparse in typical offshore projects. Even for onshore projects with a multitude of wells, labelling all of the rock types is a daunting and often impractical task. Consequently, in some embodiments the training dataset may include many (e.g., thousands) of synthetic well logs. For example, the synthetic well logs may be generated using an existing forward model, resulting in geologically-plausible data. In some embodiments, pre-defined distributions of rock properties for different rock types and/or a single-order transition matrix (meant to mimic geologic stacking patterns) may be utilized as input to generate the synthetic well logs. In some embodiments, the synthetic data may include various datasets having different frequency content (seismic and sub-seismic) and also different samplings (well log and geologic model scale) of rock types.

Methods according to some embodiments may complete after the training dataset is created at block 110. For example, one or more training datasets may be created, cataloged, stored, selected, and/or disseminated for future use with machine learning systems and/or subsurface data.

Methods according to other embodiments may continue, e.g., as is the case for method 100 illustrated in FIG. 1. It should also be noted that methods according to yet further embodiments may omit creation of training datasets 110 (e.g., where such datasets are already available). As illustrated in FIG. 1, however, method 100 continues at block 120 where a machine learning network (e.g., a convolutional neural network, or more in particular a DNN, or other suitable machine learning network) is trained with a training dataset (e.g., the created training dataset of block 110) to predict rock type probabilities. For example, the machine learning network may predict models, such as 1-D trace data, 2-D inline or crossline data, 3-D data cubes, and/or any petrophysical parameter models useful for building geologic priors. In some embodiments, training of the machine learning network may be determined by a large number of weights. Unless otherwise specified, as used herein, "weights" generally refer both to multiplicative variables (commonly known as weights) and/or to additive variables (commonly known as biases). The machine learning network may learn a preferred and/or improved setting for the large number of weights through training.

Methods according to some embodiments may complete after the machine learning network is trained at block 120. For example, one or more machine learning networks may be trained, cataloged, stored, selected, and/or disseminated for future use with machine learning systems and/or subsurface data.

As illustrated in FIG. 1, however, the method 100 continues at block 130 where an initial petrophysical parameter estimate is obtained (note that, methods according to yet further embodiments may begin at block 130, e.g., where a trained machine learning network is already available for use). Obtaining an initial petrophysical parameter estimate (130) may include, for example, generating the initial petrophysical parameter estimate as a model of porosity and/or $V_{clay}$. Also or instead, the initial petrophysical parameter estimate may be built from a prior seismic interpretation or inversion or modeled on one or more horizons. In some embodiments, the initial petrophysical parameter estimate may be as simple as a half space model with a fixed porosity and a fixed $V_{clay}$ for all parameters. In some embodiments, the initial petrophysical parameter estimate may be obtained from a pre-existing library of models.

Method 100 continues at block 140 where the trained machine learning network (e.g., from block 120) is used with the initial petrophysical parameter estimate (from block 130) to predict a geologic prior model. In some embodiments, the trained machine learning network may predict and/or classify rock type probabilities in conjunction with predicting geologic priors at block 140.

Method 100 continues with obtaining input information for the inversion. For example, at block 150, geophysical data (e.g., seismic data) is obtained. The geophysical data may include data representative of a subsurface volume (e.g., images) and corresponding identifications of geologic features for the subsurface volume (e.g., labels). As another example, at block 155, geophysical parameters (e.g., elastic parameters) are obtained. In some embodiments, elastic parameters (e.g., velocity model, resistivity model, etc.) may be derived from tomography or Full Wavefield Inversion (FWI) or other imaging/processing methods of seismic data. Suitable systems and methods for estimating geophysical parameters are further described in co-pending U.S. Publication No. 2018/0156932, entitled "Method for Estimating Petrophysical Properties for Single or Multiple Scenarios from Several Spectrally Variable Seismic and Full Wavefield Inversion Products," filed Oct. 19, 2017, which is herein incorporated by reference. The actions of blocks 150 and 155 may occur in parallel, sequentially, and/or in any order. More generally, methods according to some embodiments may include obtaining geophysical data (represented by block 150) and/or data derived therefrom (wherein the geophysical parameters represented in block 155 are an example of such data derived therefrom).

In some embodiments, a seismic survey may be conducted to acquire the input information for the inversion (noting that these and other embodiments may also or instead include obtaining other geophysical data in addition to or, or instead of, seismic data—such as obtaining, electromagnetic, electrical resistivity, gravity measurements). In these and other embodiments, simulation models may be utilized to generate synthetic input information for the inversion (e.g., computer simulation). In some embodiments, the input information for the inversion may be obtained from a library of data from previous seismic surveys or previous computer simulations. In some embodiments, obtaining input information for the inversion includes processing acquired data and/or simulated data (e.g., generating images, identifying and/or labeling features, manually and/or automatically annotating data elements). In some embodiments, a combination of any two or more of these methods may be utilized to generate the input information for the inversion.

Method 100 continues at block 160 where a petrophysical inversion is performed to generate a rock type probability model and an updated petrophysical parameter estimate. The petrophysical inversion may be based on the geologic prior model (e.g., the geologic prior model from block 140, or the geologic prior model from block 145 as further discussed below), the geophysical data from block 150, and the geophysical parameters from block 155. In some embodiments, a decoder (i.e., the generative function) of a machine learning network (e.g., from block 120) may be extracted and inserted into an objective function of the petrophysical inversion. In some embodiments, the updated petrophysical parameter estimate may be applicable to multiple scales, such as seismic scales, sub-seismic scales, and well log scales. For example, the updated petrophysical parameter estimate may include resampled data with deep learning to be applicable to multiple scales. Suitable data resampling systems and methods are further described in the aforementioned co-pending U.S. Provisional Patent Application Ser. No. 62/731,182, entitled "Reservoir Characterization Utilizing Resampled Seismic Data," filed Sep. 14, 2018.

In some embodiments, the petrophysical inversion may seek a subsurface model which is consistent with one or more geophysical data types (e.g., seismic, electromagnetic, gravity, petrophysical well-log data, etc.). In some embodiments, the decoder may replace high-dimensional variables of an output space which describe the subsurface with lower-dimensional variables in a latent space. In some embodiments, the petrophysical inversion may minimize, or at least reduce, the objective function to find a preferred low-dimensional description of the subsurface. For example, during minimization and/or reduction of the objective function, a Jacobian of the decoder may be calculated with respect to the latent-space parameters, as means to determine a data-misfit-reducing search direction in latent space. As another example, products of that Jacobian with latent-space and output-space vectors may be used, circumventing storage of a Jacobian calculation in computer memory. In some embodiments, a preferred low-dimensional description of the subsurface may be converted into high-dimensions using the decoder. In some embodiments, uncertainty in the subsurface model is assessed by running multiple inversions with different decoders extracted from machine learning networks (from block 120) trained with different training sets (from block 110), thereby incorporating different geologic assumptions, processes, or environments. In some embodiments, uncertainty in the subsurface model is assessed by running multiple inversions with different objective functions which reduce or minimize data misfit as well as minimizing/maximizing the values of any of the low-dimensional parameters or combinations thereof.

Method 100 continues at block 170 where the result of the petrophysical inversion of block 160 is checked for convergence. As will be further discussed, in the absence of convergence (e.g., at least for a specified period or number of iterations), the method 100 continues to iteratively update petrophysical parameter estimates and geologic prior models in order to iteratively perform petrophysical inversions. Convergence may be identified when the results of successive petrophysical inversions are appreciably similar, and/or when the estimated error therein is below a specified threshold. Once convergence has been identified, method 100 ends at block 180. In some embodiments, method 100 may also end at block 180 once a specified number of iterations have occurred, and/or once an error state has been identified. At the completion of method 100, a rock type probabilities model (e.g., an image, a graphical display, and/or a 3-D representation) of the subsurface region may be generated based on the geologic prior model of the final iteration. In some embodiments, the final rock type probabilities model may be used for geologic model building, geologic interpretation, seismic imaging, reservoir identification, operational planning, and/or other hydrocarbon management activities.

In the absence of convergence at block 170, method 100 iteratively continues at block 145 where the trained machine learning network (e.g., from block 120) is used with the updated petrophysical parameter estimate (from block 160 of the prior iteration) to predict an updated rock type probabilities model and/or a geologic prior model (noting that, as illustrated in FIG. 1, the method 100 includes predicting both the updated rock type probabilities model and the geologic prior model). The iteration continues anew at block 160 where another petrophysical inversion is performed. The petrophysical inversion may be based on the geologic prior model from block 145, the geophysical data from block 150, and the geophysical parameters from block 155.

Figure 2:
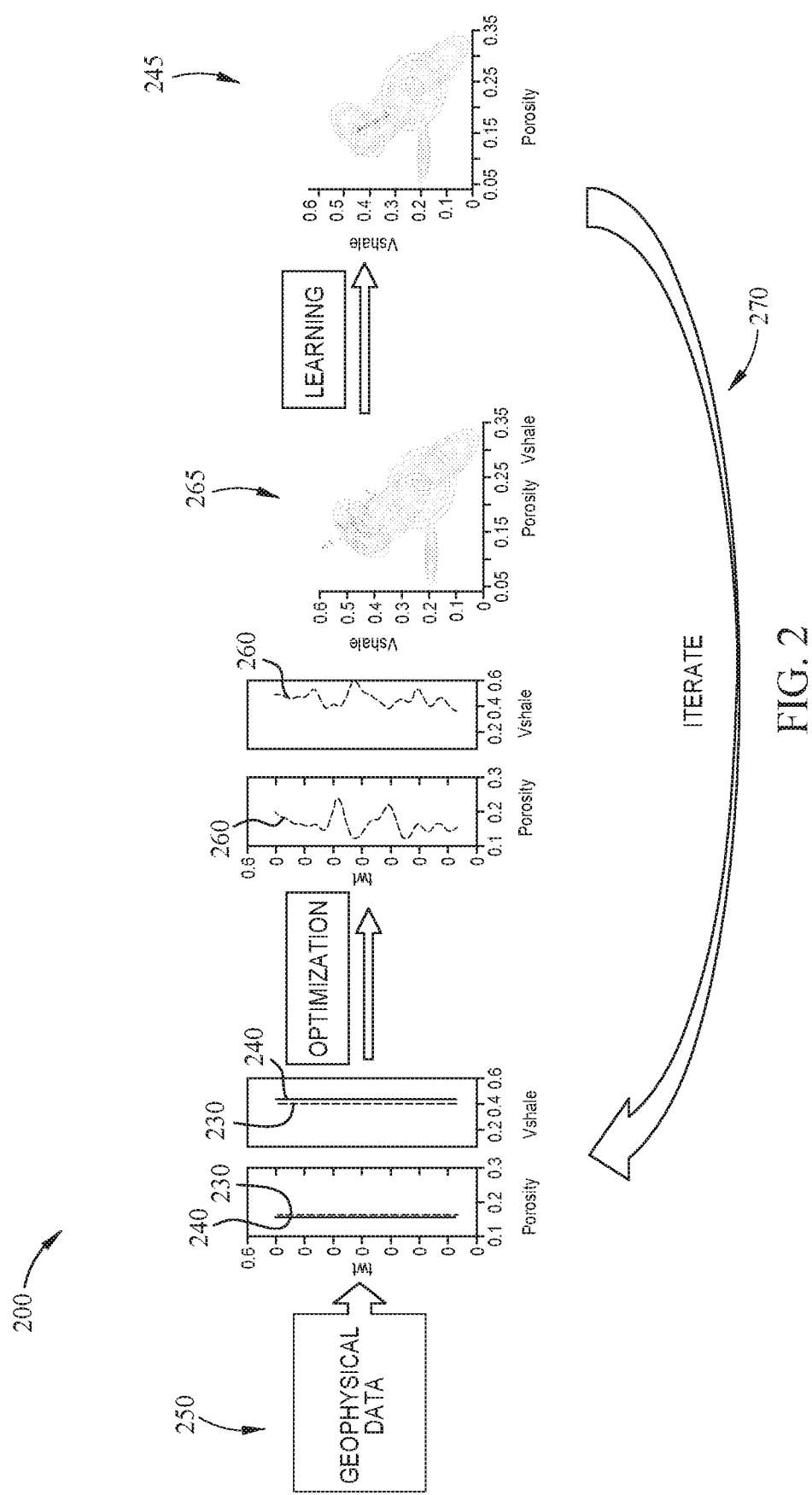
FIG. 2 illustrates an exemplary schematic of petrophysical inversion with machine learning-based geologic priors.

FIG. 2 illustrates an exemplary schematic 200 of petrophysical inversion with machine learning-based geologic priors. As illustrated, a machine learning network has been trained to predict rock type probabilities according to blocks 110 and 120 of FIG. 1. The schematic 200 illustrates using an initial petrophysical parameter estimate 230 (as from block 130 of FIG. 1) to predict a geologic prior model 240 according to block 140 of FIG. 1. The schematic 200 illustrates geophysical data 250 (as from block 150 of FIG. 1) being used together with the initial petrophysical parameter estimate 230 and geologic prior model 240 to perform a petrophysical inversion (e.g., an optimization) to generate an updated parameter estimate 260, according to block 160 of FIG. 1. Schematic 200 also illustrates use of the trained machine learning network to infer rock type probabilities 265 based on the updated parameter estimate 260, according to block 160 of FIG. 1. Schematic 200 also illustrates use of the trained machine learning network to update the rock type probabilities 265 from the inversion to generate updated rock type probabilities 245, according to block 145 of FIG. 1. Lastly, schematic 200 illustrates iteration 270 of method 100 of FIG. 1. Note that iteration 270 is illustrated in FIG. 2 following the learning and preceding the optimization. A variation of schematic 200 could equally represent iteration 270 following the optimization and preceding the learning.

In some embodiments, the machine learning network (of block 120) may include a DNN. The DNN may in certain embodiments be, for example, a recurrent neural network (RNN), a convolutional neural network (CNN), and/or a generative adversarial network (GAN).

Figure 3A:
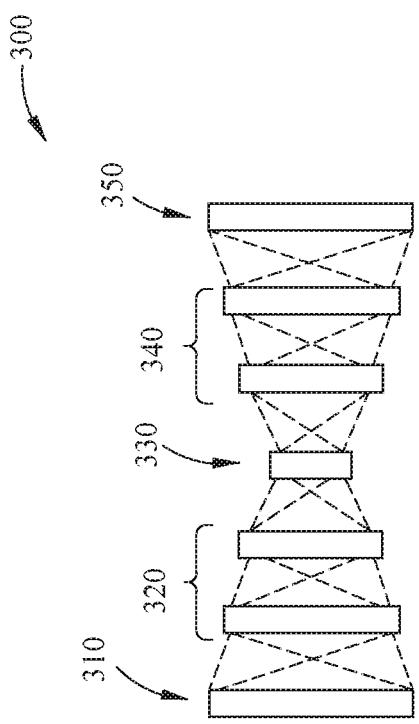
FIG. 3A illustrates an exemplary convolutional neural network (CNN) that would be suitable as the machine learning network in FIG. 1.

FIG. 3A illustrates an exemplary CNN 300 that would be suitable as the machine learning network of block 120. As illustrated, CNN 300 is generally an encoder-decoder machine learning construct with an hour-glass shape. CNN 300 may be used to characterize a low-dimensional form of patterns found in a library of geologic examples. For example, input space 310 may contain a library of geologic examples. The input space 310 may generally contain the training set for the CNN 300. During training, the encoder network 320 may characterize input space 310 in terms of a low-dimensional encoded space 330. Moreover, during training, a decoder network 340 may be found to characterize encoded space 330 in terms of an output space 350. Decoder network 340 may convert low-dimensional encoded space 330 into a full-scale (high-dimensional) model in output space 350. As such, output space 350 may conform to the geologic behavior exhibited in the training set contained in input space 310. Models in output space 350, generated by decoder network 340 of CNN 300, may be used as input to a deterministic inversion to find a geologically reasonable model, or collection of models, which are each consistent with the geophysical, petrophysical, and other observed data represented in the training set.

In some embodiments, by transforming low-dimensional parameters to high-dimensional parameters, the model-generative ability of the decoder network 340 may be utilized with an optimization (e.g., petrophysical inversion). With the benefit of the trained decoder network 340, the optimization may be able to search a low-dimensional, geology-conforming space for models which are consistent with quantifiable data (e.g., geophysical, seismic, electromagnetic, gravimetric, well-logs, core samples, etc.).

In some embodiments, the optimization may be a joint inversion. For example, a training set for joint inversion may include models which are described by multiple voxelized rock parameters: resistivity, density, compressional- or shear-wave velocities, porosity, permeability, lithology type, etc. Covariance and/or interactions between these different categories of rock description may be ingrained in the training set examples by nature of the simulations or real-world observations which created these examples. Then the decoder may capture information about the different parameter interactions and distill the interactions into a simpler "latent space" description (e.g., encoded space 330). As the joint inversion proceeds, the expected rock parameter covariance (e.g., between resistivity and velocity) may be reproduced by the decoder. Consequently, the inversion models may conform to realistic rock-parameter covariance while simultaneously fitting the various observed data (e.g., electromagnetic and seismic records).

In some embodiments, CNN 300 may extract spatial patterns common among training models. In some embodiments, the CNN 300 may approximate the common spatial patterns, for example with a non-linear function. In some embodiments, the encoder network 320 may utilize such approximations to develop the latent parameters of encoded space 330. In some embodiments, the latent parameters may be much fewer in number than the parameters of input space 310. For example, the original training models may be represented as a large number of voxelized physical properties. In some embodiments, during training, the CNN 300 produces a decoder network 340. In some embodiments, the decoder network 340 may be a non-linear function, which maps the latent parameters back to the full-dimensionality of the original training models.

Figure 3B:
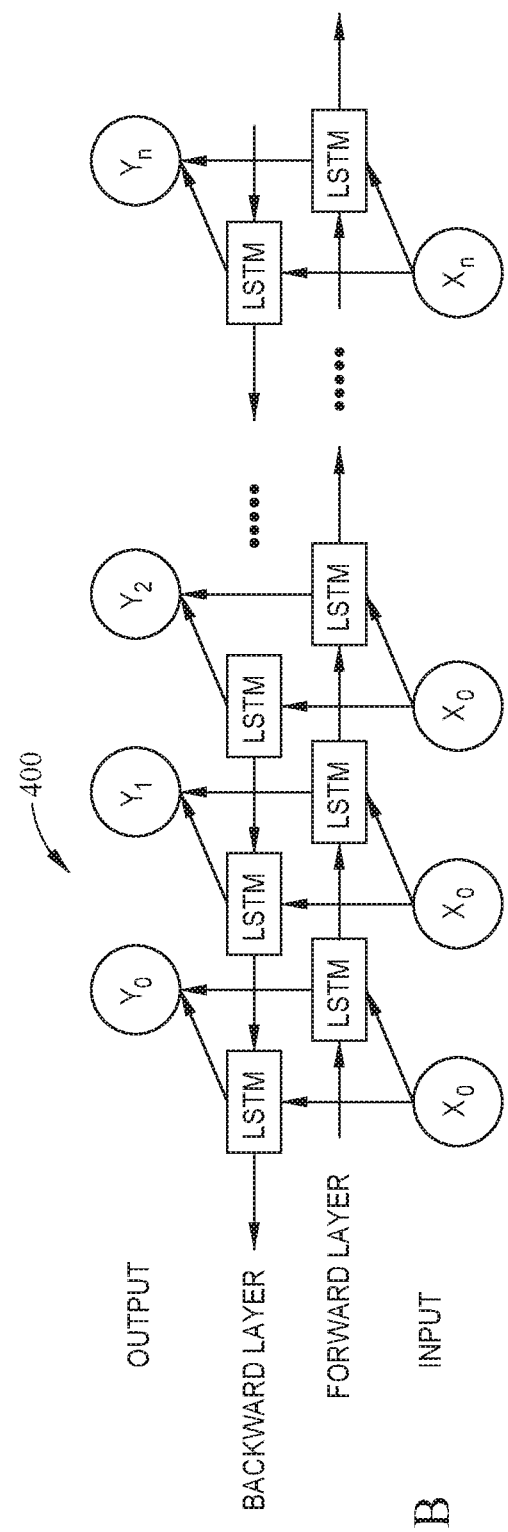
FIG. 3B illustrates an exemplary recurrent neural network (RNN) that would be suitable as the machine learning network of FIG. 1.

FIG. 3B illustrates an exemplary RNN 400 that would be suitable as the machine learning network of block 120. As illustrated, the RNN is bi-directional and includes long/short-term memory (LSTM) units. RNN 400 may advantageously provide flexibility of incorporating training data sequences of variable lengths. The LSTM units may be developed to deal with exploding and vanishing gradient problems that can be encountered when training traditional RNNs. The LSTM units may also be designed to learn long-term dependencies, which may be useful for labelling rock types. For example, the LSTM units may allow the RNN to focus on more than just local features to classify the rock type. In some embodiments, the RNN may be directional in nature, only utilizing information from the past. The illustrated embodiment utilizes complete logs, having information from both future and past. Therefore, the illustrated RNN is a bi-directional LSTM network.

In some embodiments, the machine learning network may have a modified cost function. For example, a class imbalance problem may result when the training dataset includes many examples for some rock types, but far fewer examples of other rock types. To address such a class imbalance problem, the cost function of the machine learning network may be modified to highly penalize the machine learning network for making incorrect predictions on the rock types with fewer examples.

Figures 4A, 4B, 4C, 4D, 4E, 4F:
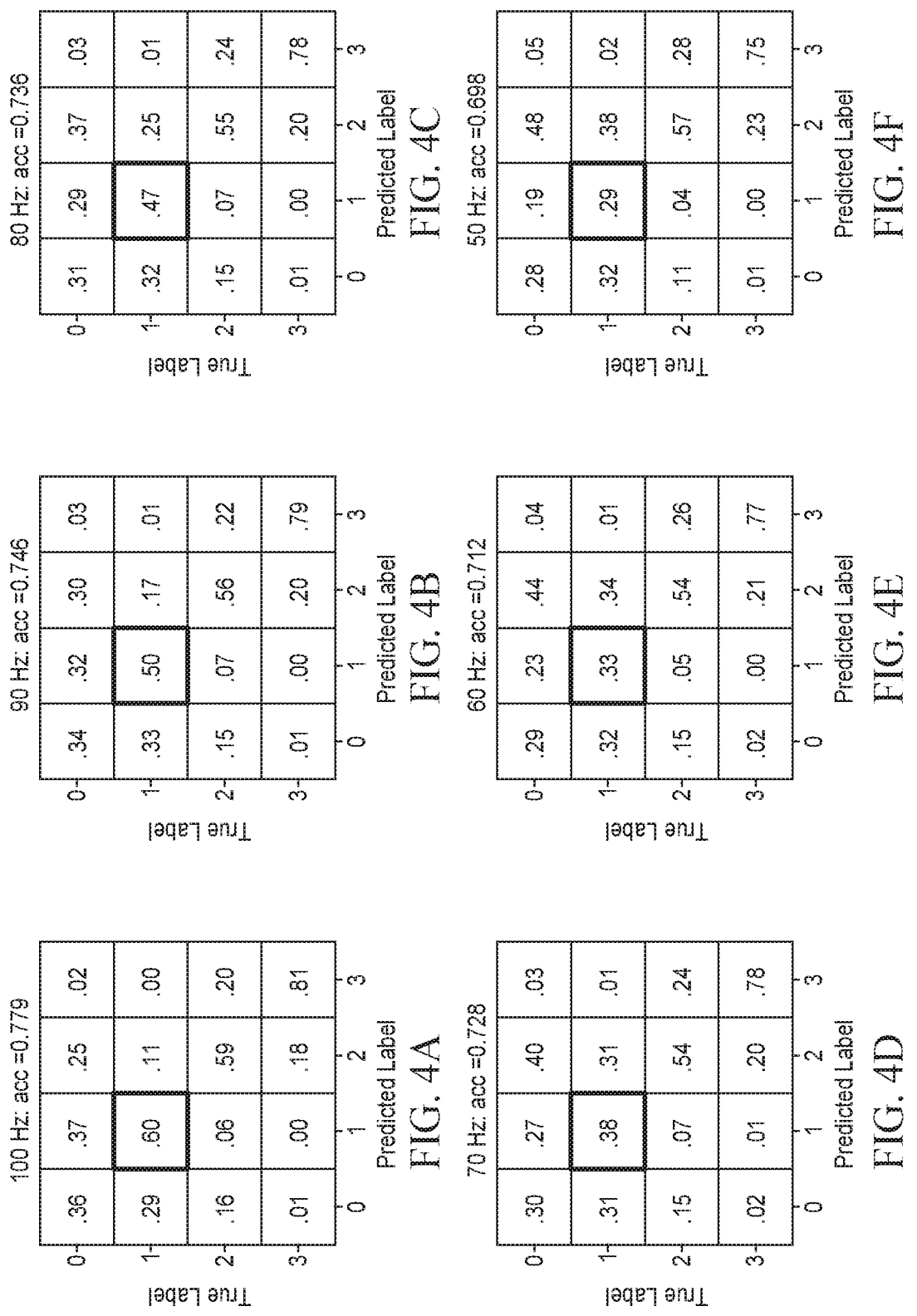

In some embodiments, different performance measures may be utilized to track the accuracy of the machine learning network (e.g., as part of the training of the machine learning network at block 120 of FIG. 1). For example, performance measures may include such measures as confusion matrices, Precision, Recall, F1-score etc. FIGS. 4A-4F illustrate an exemplary set of confusion matrices comparing the prediction accuracy of a machine learning network trained on four rock types and 40 Hz data, and making predictions on test data containing six different frequencies (e.g., simulated frequency utilized in creating synthetic seismic data during an inversion step). Each of the matrices of FIGS. 4A-4F is labeled with its corresponding "test data" frequency. As illustrated, the true rock type is classified on the vertical axes, while the predicted rock type is illustrated on the horizontal axes. It should be appreciated that perfect predictions would result in scores of "1" in each of the diagonal cells, and scores of "0" in each of the off-diagonal cells (where the diagonal tracks the cells in which the "true label" value matches the "predicted label" value; as illustrated in FIG. 4, from top left to bottom right). Consequently, a scalar measurement of accuracy may be based on a net variance from such perfect prediction. As illustrated, the prediction accuracy of the machine learning network improves as the frequency of the test data used for training the network increases.

TABLE 1

| FIG. | Frequency | Accuracy ("acc") |
|---|---|---|
| 4A | 100 Hz | 0.779 |
| 4B | 90 Hz | 0.746 |
| 4C | 80 Hz | 0.736 |
| 4D | 70 Hz | 0.728 |
| 4E | 60 Hz | 0.712 |
| 4F | 50 Hz | 0.698 |

However, per some embodiments, the frequency of training data may also be matched, as closely as feasible, to the expected frequency of input data to which the machine learning network will be applied. For example, while a machine learning network trained on 100 Hz frequency test data may give good accuracy, that same network applied to 50 Hz input data (e.g., the output of an inversion, which is at 50 Hz resolution) may not work well. Moreover, in some embodiments, the expected rock type(s) for the subsurface region of interest may influence the performance measures. For example, the performance metrics may be weighted to emphasize one or more particular frequency bands and/or one or more particular rock types based on the expected rock type(s) for the subsurface region of interest. Further, in these and other embodiments, it may be beneficial to train a more robust machine learning network (e.g., one capable of handling a variety of frequencies for its inputs), comprising training the machine learning network using training data with a plurality of different frequencies (with one example being the training using seismic scale and sub-seismic scale frequencies, discussed in more detail below).

In some embodiments, the machine learning network of block 120 may be selected from several different machine learning networks, including CNNs, RNNs, and GANs. In some embodiments, the machine learning networks may be selected based on prediction performance (e.g., Precision, Recall, F1-score, etc.) on a validation dataset and/or on a test dataset. In some embodiments, the machine learning networks may be automatically selected (e.g., based on meeting pre-set or otherwise predetermined performance prediction indicators).

Figure 5:
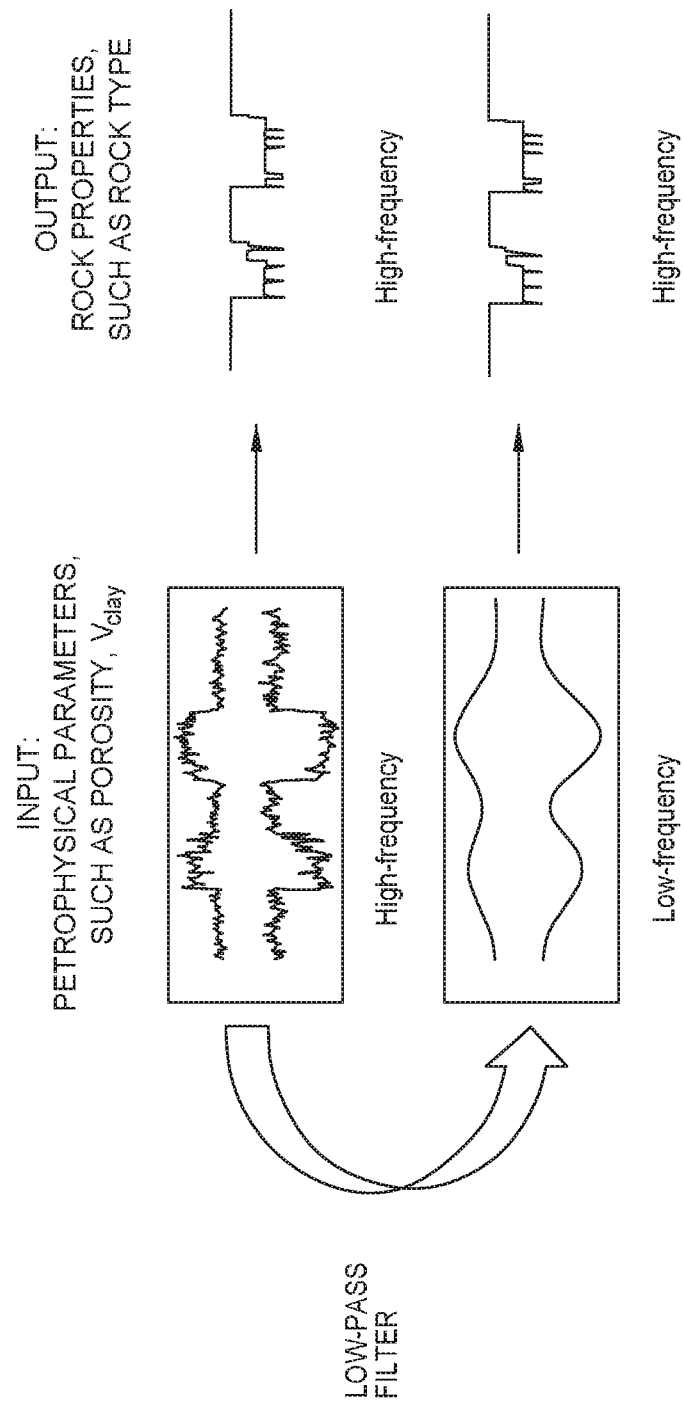
FIG. 5 illustrates prediction of rock properties from petrophysical parameters formulated as a supervised-learning problem with input/output pairs.

In some embodiments, a trained machine learning system may infer rock properties from petrophysical parameters. The machine learning system may be trained with supervised learning. As illustrated in FIG. 5, predicting rock properties (e.g., rock type) from petrophysical parameters (e.g., porosity, $V_{clay}$) may be formulated as a supervised-learning problem with input/output pairs. The input may include petrophysical parameters at both high frequency (e.g., sub-seismic scale) and low frequency (e.g., seismic scale). The machine learning system may be trained to infer rock type at sub-seismic scales even for seismic-scale input Similar to a super-resolution problem in imaging, the machine learning system may be trained with supervised learning and a low-pass filter to infer sub-seismic scale rock properties from seismic-scale petrophysical parameters. In these and similar embodiments, desired high-frequency scales (sub-seismic resolution scales) may relate to geologic features of interest and are typically finer scales not resolved by conventional seismic data (hence they are called "sub-seismic scales"). Scales resolved or not resolved by seismic data vary depending on a host of factors, such as acquisition method, depth, etc. As an example per some embodiments, one could have frequencies of 50 Hz in seismic data (seismic scale), and desired scales with relevant geologic features are at 100 Hz (sub-seismic scale). In such a case, one would train a machine learning network with training data for 50 Hz input (low resolution, seismic scales) and 100 Hz output (high resolution, subseismic scales). In other embodiments, one could have frequencies of greater than 50 Hz in seismic data, such as 60 Hz or less; 70 Hz or less; 80 Hz or less; 90 Hz or less; 100 Hz or less; 110 Hz or less; 120 Hz or less; 130 Hz or less; or even 140 Hz or less—again, depending on factors such as those noted above, as the ordinarily skilled artisan would recognize. The desired scales with relevant geologic features (sub-seismic scale) may in such cases still be even higher—such as greater than 60, 70, 80, 90, 100, 110, 120, 130, or even 140 Hz. In sum for such embodiments, then, the desired sub-seismic scales have frequency greater than the seismic scales of input data.

In some embodiments, a training set may include only elements that are each geologically plausible. The training set may include only a subspace of all possible models.

For example, the geologically plausible elements generally follow the same rules (e.g., patterns of layering: sequence, continuity, faulting; and ductile buoyancy flow: salt bodies) as seen in the training set. Rather than representing the followed-rules (which may be quite numerous) as individual constraints, the training set may be a spanning representation of how plausible geology works and/or how rocks are actually arranged. In some embodiments, the training set may be specific to a certain region of the earth. In other embodiments, the training set may generally include plausible geology for any region of the full earth. The training set may exemplify in at least one example each of the pertinent geologic rules. Thus, plausibility may be defined by the statistics of the training set.

In some embodiments, training set elements may be created from synthetic geologic models. In some embodiments, a computer simulation may be run to create some or all of the elements in the training set. For example, the training set examples may be generated with process stratigraphy (PS). Generally, PS is a method for simulating geologic patterns. PS may include a numerical simulation of the physics governing how grains of rock are transported, eroded, and/or deposited in a fluid (e.g., a simulation of sediment-laden water flowing from the outlet of a river, into an ocean, and out to the down-dip extent of a delta lobe). In some embodiments, a synthetic earth generator (e.g., a PS simulator) may produce a library of training models. Additional examples of computer simulations of geologic patterns may include salt body plastic flow simulations, geomechanical simulations, and/or basin and petroleum system simulations. Each training model may thus represent an instance of plausible geologic behavior in the subsurface region of interest.

In some embodiments, training set elements may be created from heuristic methods for producing geologic models (e.g., earth modeling with functional forms, interpreted seismic sections, and/or digitized observations of rock outcrops).

The training set elements may represent geologic parameters (e.g., three-dimensional stacking patterns of rock layers) on a scale similar to that of the desired geologic model. For example, rock layers within these models may be described by such parameters as facies type (e.g., sand, shale, or salt) and/or grain-size distributions. By merit of the rules and input parameters governing the chosen earth-model generator, the rock layers of the training set elements may adhere to depositional, erosional, tectonic physics, and/or the constraints of a specific basin (e.g., observed base morphology and historical sediment flux).

In some embodiments, a training set may be selected to include only elements that are each geologically plausible. CNN 300 may be trained with such a training set. The encoder network 320 may take any model in input space 310 and convert this model to a latent encoded space 330. For example, geologic plausibility may be measured in latent encoded space 330 by some metric (e.g., by distance from some paragon or mean latent-space model, Z). The decoder network 340 may take any geologically plausible description in latent encoded space 330 and convert this description to an output space 350, which conforms to a description usable by a physics simulator (e.g., voxelized parameters). After training, latent encoded space 330, output space 350, and decoder network 340 may then be utilized with a deterministic inversion method. The inversion may perform a parameter search in latent space. The inversion may use the decoder network (and its functional derivatives) to convert proposed models to the output space. The physical consistency of the converted proposed models may be measured with observed and/or synthetic data. For example, the synthetic data may be created by physics simulation using the output space. The inversion may produce models which reproduce physical responses that lie within acceptable proximity to those observed (e.g., subspace 362). Since the training set included only subspace 361, the inversion may thus produce geologically-plausible models within subspace 361 which are consistent with the observed data (e.g., subspace 362). In other words, such inversion may produce those models of subspace 363.

In practical applications, the present technological advancement must be used in conjunction with a geophysical data analysis system (e.g., a high-speed computer) programmed in accordance with the disclosures herein. For example, any of the petrophysical or other inversion techniques will in various of these embodiments be carried out using such a system. Likewise, generating the various models (e.g., geologic prior models, rock type probability models) and/or generating petrophysical or other parameter estimates will be carried out using such a system. Similarly, training and applying a machine learning network will be carried out using such a system. Such a geophysical data analysis system may be referred to in generic shorthand simply as a "computer." The same or a different computer (and/or geophysical data analysis system) may be used to carry out different inversions, and/or different steps of generating models, and/or different generation, training, or application of machine learning networks. Thus, referring to any of these steps as carried out "using a computer" will be understood to mean that the same or different computers may be used for such steps, unless context clearly dictates otherwise.

Preferably, a geophysical data analysis system employed for any of the aforementioned processes is a high performance computer (HPC), as known to those skilled in the art. Such high performance computers typically involve clusters of nodes, each node having multiple CPUs and/or graphics processing unit (GPU) clusters, and computer memory, with configuration that allows parallel (and particularly massively parallel) computation. The various models may be visualized and edited using any interactive visualization programs and associated hardware, such as monitors and projectors. The architecture of the system may vary and may be composed of any number of suitable hardware structures capable of executing logical operations and displaying the output according to the present technological advancement. Those of ordinary skill in the art are aware of suitable supercomputers available from Cray or IBM, as well as other architectures such as HPCs with multiple GPU clusters.

Figure 6:
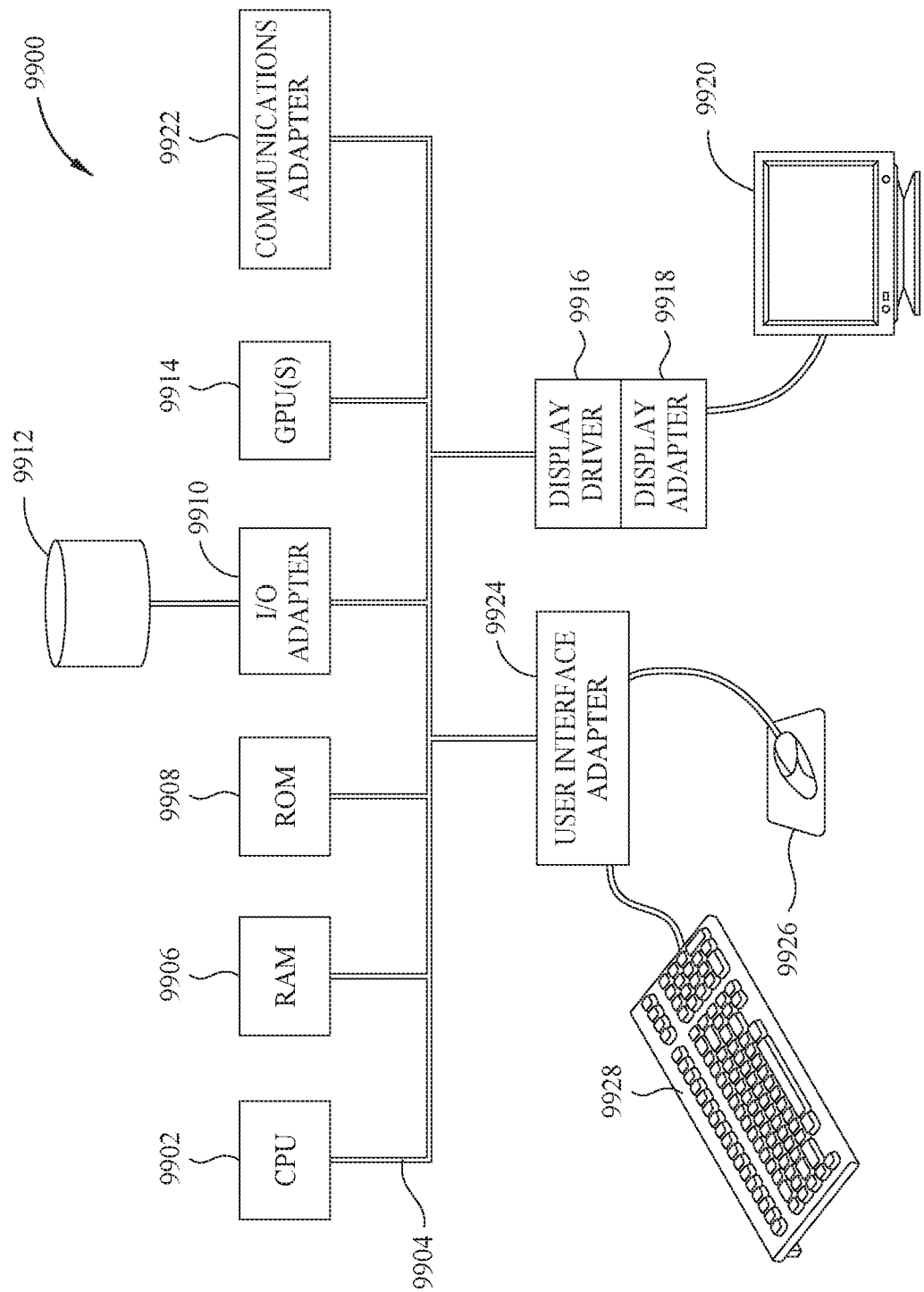
FIG. 6 illustrates a block diagram of a data analysis system upon which the present technological advancement may be embodied.

FIG. 6 illustrates a block diagram of a geophysical data analysis system 9900. A central processing unit (CPU) 9902 is coupled to system bus 9904. The CPU 9902 may be any general-purpose CPU, although other types of architectures of CPU 9902 (or other components of exemplary system 9900) may be used as long as CPU 9902 (and other components of system 9900) supports the operations as described herein. Those of ordinary skill in the art will appreciate that, while only a single CPU 9902 is shown in FIG. 6, additional CPUs may be present. Moreover, the system 9900 may comprise a networked, multi-processor computer system that may include a hybrid parallel CPU/GPU system. The CPU 9902 may execute the various logical instructions according to various teachings disclosed herein. For example, the CPU 9902 may execute machine-level instructions for performing processing according to the operational flow described.

The geophysical data analysis system 9900 may also include computer components such as non-transitory, computer-readable media. Examples of computer-readable media include a random access memory (RAM) 9906, which may be SRAM, DRAM, SDRAM, or the like. The system 9900 may also include additional non-transitory, computer-readable media such as a read-only memory (ROM) 9908, which may be PROM, EPROM, EEPROM, or the like. RAM 9906 and ROM 9908 hold user and system data and programs, as is known in the art. The system 9900 may also include an input/output (I/O) adapter 9910, a communications adapter 9922, a user interface adapter 9924, and a display adapter 9918; the system 9900 may potentially also include one or more graphics processor units (GPUs) 9914, and one or more display driver(s) 9916.

The I/O adapter 9910 may connect additional non-transitory, computer-readable media such as a storage device(s) 9912, including, for example, a hard drive, a compact disc (CD) drive, a floppy disk drive, a tape drive, and the like to geophysical data analysis system 9900. The storage device(s) may be used when RAM 9906 is insufficient for the memory requirements associated with storing data for operations of the present techniques. The data storage of the system 9900 may be used for storing information and/or other data used or generated as disclosed herein. For example, storage device(s) 9912 may be used to store configuration information or additional plug-ins in accordance with the present techniques. Further, user interface adapter 9924 couples user input devices, such as a keyboard 9928, a pointing device 9926 and/or output devices to the system 9900. The display adapter 9918 is driven by the CPU 9902 to control the display on a display device 9920 to, for example, present information to the user. For instance, the display device may be configured to display visual or graphical representations of any or all of the models discussed herein, and/or to display visual to or graphical representations of a subsurface region (e.g., based at least in part upon any one or more of the models or parameters described and/or generated herein).

The architecture of geophysical data analysis system 9900 may be varied as desired. For example, any suitable processor-based device may be used, including without limitation personal computers, laptop computers, computer workstations, and multi-processor servers. Moreover, the present technological advancement may be implemented on application specific integrated circuits (ASICs) or very large scale integrated (VLSI) circuits. In fact, persons of ordinary skill in the art may use any number of suitable hardware structures capable of executing logical operations according to the present technological advancement. The term "processing circuit" encompasses a hardware processor (such as those found in the hardware devices noted above), ASICs, and VLSI circuits. Input data to the system 9900 may include various plug-ins and library files. Input data may additionally include configuration information.

Geophysical data analysis system 9900 may include one or more machine learning architectures, such as autoencoders and convolutional neural networks (or any other suitable network such as those discussed and referenced herein). The machine learning architectures may be trained on various training datasets in accordance with the description herein. The machine learning architectures may be applied to analysis and/or problem solving related to various unanalyzed datasets. It should be appreciated that the machine learning architectures perform training and/or analysis that exceed human capabilities and mental processes. The machine learning architectures, in many instances, function outside of any preprogrammed routines (e.g., varying functioning dependent upon dynamic factors, such as data input time, data processing time, dataset input or processing order, and/or a random number seed). Thus, the training and/or analysis performed by machine learning architectures is not performed by predefined computer algorithms and extends well beyond mental processes and abstract ideas.

The above-described techniques, and/or systems implementing such techniques, can further include hydrocarbon management based at least in part upon the above techniques. For instance, methods according to various embodiments may include managing hydrocarbons based at least in part upon models of subsurface regions and/or uncertainty therein constructed according to the above-described methods. In particular, such methods may include drilling a well, and/or causing a well to be drilled, based at least in part upon the models of subsurface regions and/or uncertainty therein (e.g., such that the well is located based at least in part upon a location determined from the models of subsurface regions and/or uncertainty therein, which location may optionally be informed by other inputs, data, and/or analyses, as well) and further prospecting for and/or producing hydrocarbons using the well.

The foregoing description is directed to particular example embodiments of the present technological advancement. It will be apparent, however, to one skilled in the art, that many modifications and variations to the embodiments described herein are possible. All such modifications and variations are intended to be within the scope of the present disclosure, as defined in the appended claims. Persons skilled in the art will readily recognize that in preferred embodiments of the invention, some or all of the steps in the present inventive method are performed using a computer, i.e., the invention is computer implemented. In such cases, the fluid saturation models (and/or images generated of a subsurface region based on such models) may be downloaded or saved to computer storage, and/or displayed using a computer and/or associated display.

The invention claimed is:

1. A method for modeling a subsurface region, comprising:
    obtaining a trained machine learning network, the trained machine learning network being trained at a frequency of training data that is matched to an expected frequency of input data to which the machine learning network is applied;
    obtaining an initial petrophysical parameter estimate;
    applying the trained machine learning network to the initial petrophysical parameter estimate to predict a geologic prior model;
    obtaining geophysical data for the subsurface region;
    obtaining geophysical parameters for the subsurface region; and
    performing a petrophysical inversion with the geologic prior model, geophysical data, and geophysical parameters to generate a rock type probability model and an updated petrophysical parameter estimate;
    wherein each one of (i) applying the trained machine learning network and (ii) performing the petrophysical inversion is carried out using a geophysical data analysis system.

2. The method of claim 1, wherein the geophysical data comprise seismic data, and the geophysical parameters comprise elastic parameters.

3. The method of claim 2, wherein the elastic parameters are derived from the seismic data.

4. The method of claim 1, wherein the petrophysical inversion comprises an optimization procedure.

5. The method of claim 1, wherein the initial petrophysical parameter estimate and the updated petrophysical parameter estimate each comprise at least one of porosity and volume of clay.

6. The method of claim 1, wherein obtaining the trained machine learning network comprises training the machine learning network with a training dataset to predict rock type probabilities from petrophysical parameters.

7. The method of claim 6, wherein the machine learning network is trained to predict rock type probabilities at sub-seismic scales for inputs comprising petrophysical parameters obtained from seismic-scale data.

8. The method of claim 6, wherein the training dataset comprises a plurality of datasets having different frequency content and different sampling scales.

9. The method of claim 8, wherein the different frequency content and different sampling scales of the datasets include both sub-seismic scale and seismic scale datasets, wherein the frequency of sub-seismic scale datasets is higher than the frequency of the seismic scale datasets.

10. The method of claim 6, further comprising creating the training dataset by generating synthetic well logs using an existing forward model.

11. The method of claim 6, wherein the training dataset comprises at least 1000 well logs.

12. The method of claim 1, further comprising:
after performing the petrophysical inversion, checking for convergence of the updated petrophysical parameter estimate; and
if the check for convergence fails, iteratively:
applying the trained machine learning network to the updated petrophysical parameter estimate of a preceding iteration to predict an updated rock type probability model and another geologic prior model;
performing a petrophysical inversion with the another geologic prior model, geophysical data, and geophysical parameters to generate another rock type probability model and another updated petrophysical parameter estimate; and
checking for convergence of the another updated petrophysical parameter estimate.

13. The method of claim 1, wherein the machine learning network comprises at least one of a deep neural network, a recurrent neural network, a convolutional neural network, and a generative adversarial network.

14. The method of claim 1, further comprising managing hydrocarbons based at least in part upon the rock type probability model.

15. The method of claim 1, wherein the geophysical data analysis system comprises:
a processor; and
a display configured to display graphical representations of a geophysical dataset, wherein the processor is configured to:
apply the trained machine learning network to the initial petrophysical parameter estimate to predict the geologic prior model; and
perform the petrophysical inversion with the geologic prior model, geophysical data for a subsurface region, and geophysical parameters for the subsurface region to generate the rock type probability model and the updated petrophysical parameter estimate.

16. A method of hydrocarbon management comprising:
obtaining a trained machine learning network, wherein obtaining the trained machine learning network comprises training the machine learning network with a training dataset to predict rock type probabilities at sub-seismic scales from input comprising petrophysical parameters obtained from seismic-scale data, the trained machine learning network being trained at a frequency of training data that is matched to an expected frequency of input data to which the machine learning network is applied;
obtaining an initial petrophysical parameter estimate;
applying the trained machine learning network to the initial petrophysical parameter estimate to predict a geologic prior model;
obtaining geophysical data for a subsurface region;
obtaining geophysical parameters for the subsurface region;
performing a petrophysical inversion with the geologic prior model, geophysical data, and geophysical parameters to generate a rock type probability model and an updated petrophysical parameter estimate;

interpreting the rock type probability model to identify geologic features of the subsurface region; and
managing hydrocarbons based at least in part upon the identified geologic features;
wherein each one of (i) applying the trained machine learning network and (ii) performing the petrophysical inversion is carried out using a geophysical data analysis system.

17. The method of claim 16, wherein:
the geophysical data comprise seismic data,
the geophysical parameters comprise elastic parameters, and
the elastic parameters are derived from the seismic data.

18. The method of claim 16, wherein the petrophysical inversion comprises an optimization procedure.

19. The method of claim 16, wherein the initial petrophysical parameter estimate and the updated petrophysical parameter estimate each comprise at least one of porosity and volume of clay.

20. The method of claim 19, further complising creating the training dataset by generating synthetic well logs using an existing forward model.

21. The method of claim 19, wherein the training dataset comprises at least 1000 well logs.

22. The method of claim 19, wherein the training dataset comprises a plurality of datasets having different frequency content and different sampling scales.

23. The method of claim 22, wherein the plurality of datasets include one or more seismic scale datasets and one or more sub-seismic scale datasets of higher frequency than the frequency of the seismic scale datasets.

24. The method of claim 16, further comprising, using the geophysical data analysis system:
after performing the petrophysical inversion, checking for convergence of the updated petrophysical parameter estimate; and
if the check for convergence fails, iteratively:
applying the trained machine learning network to the updated petrophysical parameter estimate of a preceding iteration to predict an updated rock type probability model and another geologic prior model;
performing a petrophysical inversion with the another geologic prior model, geophysical data, and geophysical parameters to generate another rock type probability model and another updated petrophysical parameter estimate; and
checking for convergence of the another updated petrophysical parameter estimate.

25. The method of claim 16, wherein the machine learning network comprises at least one of a deep neural network, a recurrent neural network, a convolutional neural network, and a generative adversarial network.

26. The method of claim 16, wherein the geophysical data analysis system comprises a processor; and
a display configured to display graphical representations of a geophysical dataset, wherein the processor is configured to:
apply the trained machine learning network to the initial petrophysical parameter estimate to predict the geologic prior model; and
perform the petrophysical inversion with the geologic prior model, geophysical data for a subsurface region, and geophysical parameters for the subsurface region to generate the rock type probability model and the updated petrophysical parameter estimate.

* * * * *